United States Patent [19]
Nakatani et al.

[11] Patent Number: 6,060,150
[45] Date of Patent: May 9, 2000

[54] SHEET FOR A THERMAL CONDUCTIVE SUBSTRATE, A METHOD FOR MANUFACTURING THE SAME, A THERMAL CONDUCTIVE SUBSTRATE USING THE SHEET AND A METHOD FOR MANUFACTURING THE SAME

[75] Inventors: Seiichi Nakatani; Hiroyuki Handa, both of Osaka, Japan

[73] Assignee: Matsushita Electric Industrial Co., Ltd., Osaka, Japan

[21] Appl. No.: 08/944,799

[22] Filed: Oct. 6, 1997

[30] Foreign Application Priority Data

Oct. 9, 1996 [JP] Japan .................................. 8-268357

[51] Int. Cl.⁷ .................................................. B32B 3/00
[52] U.S. Cl. .......................... 428/209; 428/901; 174/258; 165/185; 361/739
[58] Field of Search ..................... 428/209, 901, 428/413; 174/258; 165/185; 524/404, 433, 428, 611, 612; 361/739

[56] References Cited

U.S. PATENT DOCUMENTS

| | | | |
|---|---|---|---|
| 4,311,753 | 1/1982 | Pucci | 428/901 |
| 4,477,512 | 10/1984 | Thomas et al. | 428/901 |
| 4,501,787 | 2/1985 | Marchetti et al. | 428/901 |
| 4,599,268 | 7/1986 | Chellis | 428/901 |
| 4,617,584 | 10/1986 | Ikeya et al. | 428/901 |
| 4,656,207 | 4/1987 | Jabloner et al. | 428/901 |
| 4,710,429 | 12/1987 | Bogan et al. | 428/901 |
| 4,975,319 | 12/1990 | Walles et al. | 428/901 |
| 5,266,385 | 11/1993 | Ishii et al. | 428/901 |
| 5,419,946 | 5/1995 | Takanezawa et al. | 428/206 |
| 5,434,199 | 7/1995 | Gallagher et al. | 428/901 |
| 5,576,362 | 11/1996 | Watanabe et al. | 428/901 |
| 5,670,250 | 9/1997 | Sanville, Jr. et al. | 428/901 |

FOREIGN PATENT DOCUMENTS 8-73621 3/1996 Japan .

*Primary Examiner*—Cathy F. Lam
*Attorney, Agent, or Firm*—Morrison & Foerster LLP

[57] ABSTRACT

A thermally conductive substrate having a structure in which inorganic filler for improving the thermal conductivity and thermosetting resin composition are included. The thermosetting resin composition has a flexibility in the not-hardened state, and becomes rigid after hardening. The thermally conductive substrate has excellent thermal radiation characteristics. The method of manufacturing the thermally conductive substrate includes: piling up (a) the thermally conductive sheets comprising 70 to 95 weight parts of an inorganic filler, and 4.9 to 28 weight parts of a thermosetting resin composition, the thermosetting resin composition comprising at least one thermosetting resin, a hardener and a hardening accelerator, and (b) lead frame on which a wiring is formed; thermal pressing the pile; filling the thermally conductive sheet to the surface of the lead frame; hardening the thermosetting resin; cutting excess sections of the thermally conductive substrate; and processing the bending perpendicularly for making a removable electrode.

23 Claims, 7 Drawing Sheets

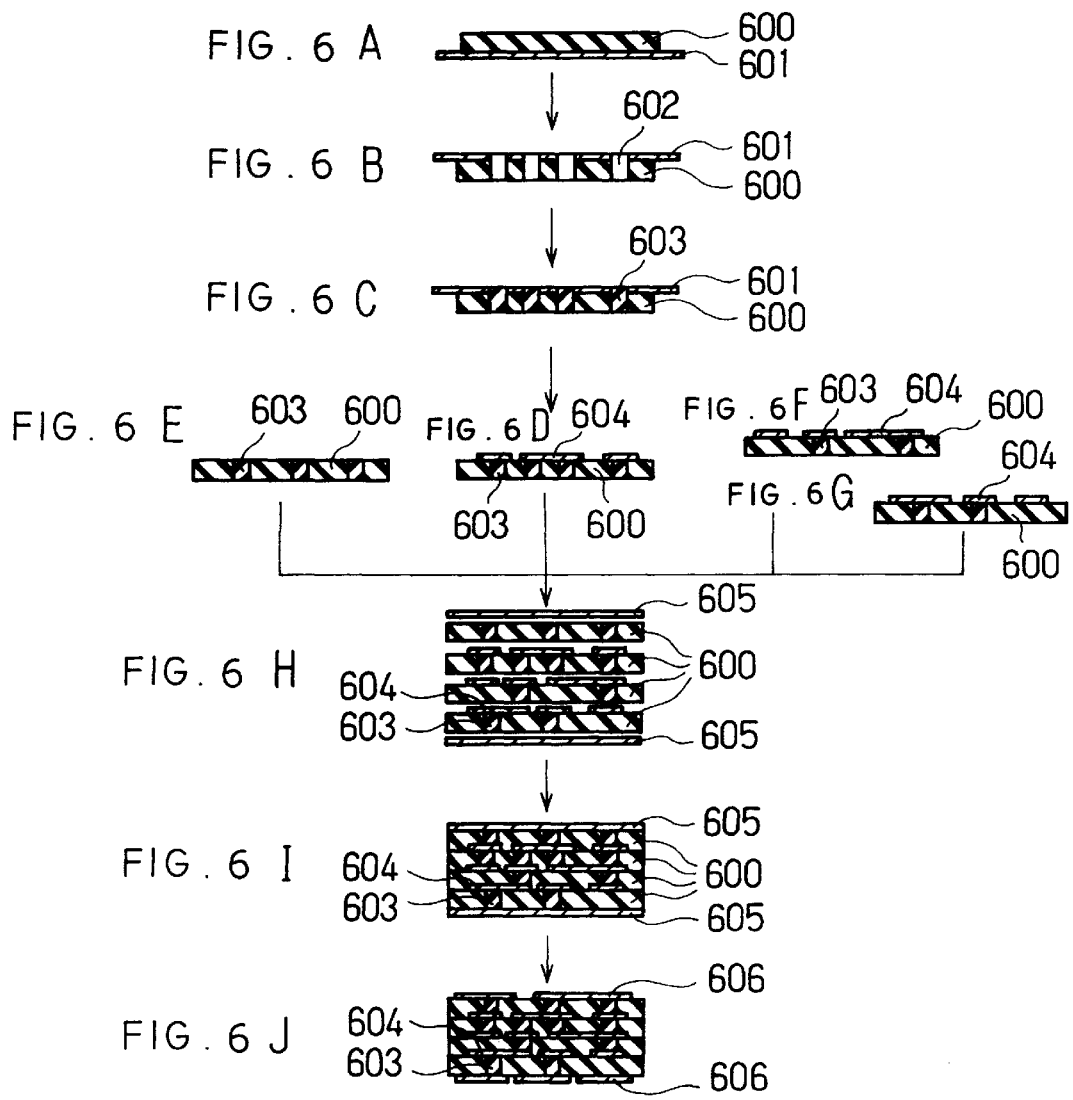

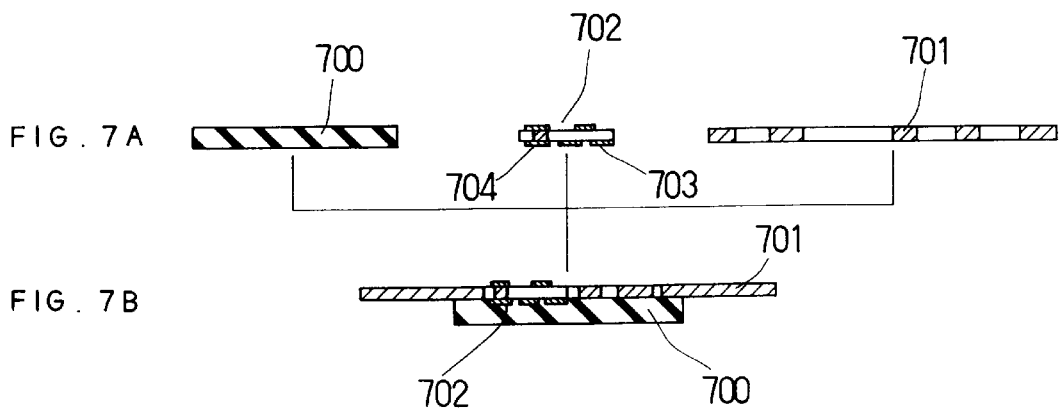

SHEET FOR A THERMAL CONDUCTIVE SUBSTRATE, A METHOD FOR MANUFACTURING THE SAME, A THERMAL CONDUCTIVE SUBSTRATE USING THE SHEET AND A METHOD FOR MANUFACTURING THE SAME

FIELD OF THE INVENTION

The invention relates to a circuit substrate whose thermal radiation property is improved by a mixture of resin and inorganic filler. In particular, it relates to a high thermal radiation printed wiring board made of resin (thermally conductive substrate) for mounting electronic power devices.

BACKGROUND OF THE INVENTION

Recently, as high performance and miniaturization of the electronic apparatus have been required, high density and high performance semiconductors have been sought. Consequently, circuit substrates for mounting thereof have also been required to be small and of high density. As a result, it is important to design circuit substrates taking the thermal radiation property into consideration. A well known technique for improving the thermal radiation property of circuit substrates, while using a printed circuit board made of glass-epoxy resin, is to use, a metal base substrate having a metal, for example, aluminum etc. and form a circuit pattern on one face or both faces of this metal substrate with an insulating layer interposed in between the circuit pattern and the metal substrate. Moreover, when higher thermal conductivity is required, the metal base substrate is made of a copper plate, which is directly bonded to a ceramic substrate made of, for example, alumina or aluminum nitride. For an application requiring relatively small electric power, a metal base substrate is generally used. In this case, however, in order to improve the thermal conduction, the insulating layer must be thin. Therefore, as for the substrate of thin insulating layer, break down voltage is low, and the influence by the noise, too, is big.

It is difficult for the metal base substrate and ceramic substrate to satisfy both performance and cost requirements. Recently, an injection molded thermally conductive module has been suggested, where a thermoplastic resin composition containing inorganic filler is integrated with the lead frame of an electrode. This injection molded thermally conductive module has excellent mechanical strength in comparion with a ceramic substrate. However, due to the high viscosity of the thermoplastic resin, it is difficult to injection mold such a module with a high filler content, and so the thermal radiation property of module is poor. In particular, at the time of melting the thermoplastic resin at high temperature and kneading with filler, if there is too much filler, the melting viscosity is rapidly increased in a point that not only kneading but also injection molding is made impossible. Moreover, the filler serves as an abrasives to abrade the metallic mold, and, thus, reduces the life of the mold. Consequently, the content of the filler is limited, so that only lower thermal conductivity can be obtained as compared with the thermal conductivity of the ceramic substrate.

SUMMARY OF THE INVENTION

The object of the present invention is to overcome the above mentioned problems and to provide a sheet for a thermally conductive substrate in which an inorganic filler can be filled in a resin at a high filler loading to form a thermally conductive module by a simple method, having (a) approximately the same coefficient of the thermal expansion in the plane direction of the substrate as that of a semiconductor, and (b) excellent thermal radiation property; a method for manufacturing the above mentioned sheet for a thermally conductive substrate; a thermally conductive substrate using the above mentioned sheet; and a method for manufacturing this thermally conductive substrate.

In order to attain the objects, the sheet for the thermally conductive substrate of the present invention is a sheet mixture comprising 70 to 95 weight parts of inorganic filler and 5 to 30 weight parts of resin composition comprising at least thermosetting resin, hardener and hardening accelerator. This sheet mixture has a good flexibility in the half hardened state or partially hardened state. (Hereinafter, "B stage" will be used for the half hardened state or partially hardened state.) This sheet mixture of the thermally conductive substrate can be molded and processed into a predetermined shape due to the flexibility of the sheet. On complete hardening of the resin composition, the substrate can be made rigid with excellent mechanical strength.

It is preferable in the sheet for the thermally conductive substrate of the present invention that the half hardened state or partially hardened state has a viscosity in the range of $10^2$ to $10^5$ (Pa·s). By such a preferred embodiment, excellent flexibility and processing property can be provided, so that the sheet can be molded and processed into the predetermined shape. More preferably, the half hardened state or partially hardened state has a viscosity in the range of $10^3$ to $10^4$ (Pa·s). The viscosity of the sheet herein is measured by the following method: the apparatus used for measuring the elasto-viscosity was a "cone and plate" type dynamic measurement apparatus, MR-500, the product of Rhelogy Co., Ltd.; the sheet was processed into the predetermined size and sandwiched between the cone and plate having a diameter of 17.97 mm and cone angle of 1.15 deg.; sinusoidal oscillation was given to the sample in the twisting direction; and the difference in the phases of torque which was generated by the sinusoidal oscillation was calculated. Thus, the viscosity was measured. In the evaluation of the elasto-viscosity of the sheet of the present invention, the sinusoidal oscillation was a sine wave with a frequency of 1 Hz, the strain was 0.1 deg., the load was 500 g and the temperature was 25° C.

It is preferable in the sheet for the thermally conductive substrate of the present invention that 0.1 to 2 weight parts of solvent having a boiling point of not less than 150° C. is further added to 100 weight parts of total weight of inorganic filler and thermosetting resin composition. By this preferred embodiment, excellent flexibility and processing property can be provided.

It is preferable in the sheet for the thermally conductive substrate of the present invention that the solvent having a boiling point of not less than 150° C. is at least one solvent selected from the group consisting of ethyl carbitol, butyl carbitol and butyl carbitol acetate. By this preferred embodiment, the processing of the sheet material is easy, flexibility can be provided to the thermosetting resin at room temperature, and the viscosity of the sheet material for molding and processing can easily be controlled.

It is preferable in the thermosetting resin composition in the sheet for the thermally conductive substrate of the present invention to comprise:

1) 0 to 45 weight parts of a first resin that is solid at room temperature, 2) 5 to 50 weight parts of a second resin that is liquid at room temperature, 3) 4.9 to 45 weight parts of the hardener, and
4) 0.1 to 5 weight parts of the hardening accelerator when the thermosetting resin composition is 100 weight parts. By such a preferred embodiment, excellent flexibility and processing property can be provided.

It is preferable in the sheet for the thermally conductive substrate of the present invention that the main component of the thermosetting resin that is solid at room temperature is one or more components selected from the group consisting of bisphenol A epoxy resin, bisphenol F epoxy resin and liquid phenol resin. By this preferred embodiment, the "B stage" resin has a long shelf life and the hardened resin has excellent electrical insulating property and mechanical strength.

It is preferable in the sheet for the thermally conductive substrate of the present invention that the main component of the thermosetting resin composition is at least one resin selected from the group consisting of epoxy resin, phenol resin and cyanate resin.

It is preferable in the sheet for the thermally conductive substrate of the present invention that the thermosetting resin composition comprises brominated multifunctional epoxy resin as a main component, bisphenol A novolak resin as a hardener, and imidazole as a hardening accelerator. By such a preferred embodiment, the substrate can be made excellent in flame retardant property, electric insulating property and mechanical strength.

It is preferable in the sheet for the thermally conductive substrate of the present invention that the brominated multifunctional epoxy resin be in the range of 60 to 80 weight parts; bisphenol A novolak resin as a hardener be in the range of 18 to 39.9 weight parts, and imidazole as a hardening accelerator be in the range of 0.1 to 2 weight parts.

It is preferable in the sheet for the thermally conductive substrate of the present invention that the inorganic filler is at least one kind of filler selected from the group consisting of $Al_2O_3$, MgO, BN and AlN, because these fillers are excellent in thermal conductivity.

It is preferable in the sheet for the thermally conductive substrate of the present invention that at least one additives is selected from the group consisting of coupling agent, dispersing agent, coloring agent and tack free agent is further added to the sheet for a thermally conductive substrate.

Next, the thermally conductive substrate of the present invention is characterized in that when the thermosetting resin component of the thermally conductive substrate sheet is hardened, the coefficient of thermal expansion is in the range of 8 to 20 ppm/° C. and the thermal conductivity is in the range of 1 to 10 W/mK. In the thermally conductive substrate, thermal deformation or the like is not generated and the coefficient of thermal expansion approximates that of a semiconductor.

It is preferable in the sheet for the thermally conductive substrate of the present invention that the flexural strength of the thermally conductive substrate is not less than 10 Kgf/mm². If the flexural strength is within the above mentioned range, practical mechanical strength can be obtained. The flexural strength herein is measured according to JIS R-1601 (the testing method of bending strength of fine ceramics) in the following manner: test sample is cut in a predetermined size; the test sample is placed on two supporting points which are located at certain distance; load is applied to the middle point of the test sample between two supporting points; the maximum bending stress when the test sample breaks is measured and this value is defined as flexural strength. This value is also called the three-point bending strength.

The dimensions of the test sample are as follows:
Whole Length (Lr): 36 mm
Width (w): 4.0±0.1 mm
Thickness (t): 3.0±0.1 mm The bending strength is calculated by the following equation:

$$\sigma = 3PL/2wt^2$$

wherein $\sigma$ denotes the three-point bending strength (kgf/mm²), P denotes the maximum load when the test piece is broken, L denotes the distance between lower supporting points (mm), w denotes the width of the test piece (mm) and t denotes the thickness of the test piece (mm).

It is preferable in the sheet for the thermally conductive substrate of the present invention that the flexural strength is in the range of 10 to 20 Kgf/mm².

It is preferable in the sheet for the thermally conductive substrate of the present invention that a lead frame is further integrated to the thermally conductive substrate, and the thermally conductive substrate is filled to the surface of the lead frame. By such a preferred embodiment, electronic parts can easily be attached to the lead frame and thermal resistance for connecting thermal radiation can be inhibited. Moreover, soldering terminals for connecting a removable electrode are not required. Instead, the lead frame can be connected directly to an outside signal source, which may be an electrode for taking current. Thus, reliability by such a preferred embodiment is excellent.

It is preferable in the sheet for the thermally conductive substrate of the present invention that a metal substrate for thermal radiation is further formed on the face opposite to the face to which the lead frame is adhered to the thermally conductive substrate. By such a preferred embodiment, thermal resistance can be further decreased and the mechanical strength is improved.

It is preferable in the sheet for the thermally conductive substrate of the present invention that a printed circuit board having two or more wiring layers be integrated into a part of the face of the thermally conductive substrate to which the lead frame is adhered, the thermally conductive substrate be filled to the surface of the lead frame, and the printed circuit board comprises two or more wiring layers. By such a preferred embodiment, the control circuit for overcurrent protection or temperature compensation can be integrated into the substrate. Thus, miniaturization and high density of the apparatus can be realized.

It is preferable in the sheet for the thermally conductive substrate of the present invention that the thermally conductive substrate has a through hole. The through hole is filled with conductive resin composition or is plated with copper, and a metallic foil wiring pattern is formed and integrated on both sides of the substrate. By such a preferred embodiment, double-sided wiring substrate which is excellent in thermal radiation can be obtained.

It is preferable in the sheet for the thermally conductive substrate of the present invention that a plurality of the thermally conductive substrates are layered and each thermally conductive substrate has a through hole. The through hole is filled with conductive resin composition and an internal wiring pattern is composed of conductive resin composition. In addition, a metallic foil wiring pattern is formed and integrated on both sides of the substrate. By such a preferred embodiment, conductivity between layers of the thermally conductive substrate is excellent and internal wiring pattern can be formed. Furthermore, excellent thermal conductivity can be provided.

It is preferable in the sheet for the thermally conductive substrate of the present invention that the metallic foil is a copper foil having a thickness of 12 to 200 μm and having faces at least one surface of which is a rough surface.

It is preferable in the sheet for the thermally conductive substrate of the present invention that the conductive resin composition comprises 70 to 95 weight parts of at least one metallic powder selected from the group consisting of silver, copper and nickel; and 5 to 30 weight parts of thermosetting resin and hardener.

It is preferable in the sheet for the thermally conductive substrate of the present invention that the inorganic filler has an average particle diameter of 0.1 to 100 μm.

The first method of manufacturing the sheet for the thermally conductive substrate of the present invention comprises the steps of: forming a slurry mixture comprising 70 to 95 weight parts of an inorganic filler, 4.9 to 28 weight parts of a thermosetting resin composition and 0.1 to 2 weight parts of a solvent having a boiling point of not less than 150° C. and solvent having a boiling point not more than 100° C.; forming the slurry mixture into a film having a desired thickness; and drying the solvent having a boiling point of not more than 100° C. of the film slurry.

The second method of manufacturing the sheet for the thermally conductive substrate of the present invention comprises the steps of: forming a slurry mixture comprising 70 to 95 weight parts of inorganic filler, 5 to 30 weight parts of thermosetting resin mixture comprising a solid of thermosetting resin that is solid at room temperature and a liquid thermosetting resin that is liquid at room temperature and solvent having a boiling point not more than 100° C.; forming the slurry mixture into a film having a desired thickness; and drying only the solvent having a boiling point of not more than 100° C. of the film slurry.

It is preferable in the second manufacturing method that the thermosetting resin mixture in the sheet for thermally conductive substrate made according to the second method, comprises:

1) 0 to 45 weight parts of resin that is solid at room temperature,
2) 5 to 50 weight parts of resin that is liquid at room temperature,
3) 4.9 to 45 weight parts of hardener, and
4) 0.1 to 5 weight parts of hardening accelerator when the total weight of the solid thermosetting resin and the liquid thermosetting resin 100 is weight parts.

It is further preferable in the second manufacturing method that the main component of the solid thermosetting resin is one or more components selected from the group consisting of bisphenol A epoxy resin, bisphenol F epoxy resin and liquid phenol resin.

It is preferable in the first and second manufacturing methods that the thermosetting resin mixture comprises a brominated multifunctional epoxy resin as a main component, a bisphenol A novolak resin as a hardener, and an imidazole as a hardening accelerator.

It is preferable in the first and second manufacturing methods that the sheet for a thermally conductive substrate comprises a brominated multifunctional epoxy resin in the range of 60 to 80 weight parts; a bisphenol A novolak resin as a hardener in the range of 18 to 39.9 weight parts, and an imidazole as a hardening accelerator in the range of 0.1 to 2 weight parts.

It is preferable in the first manufacturing method that the solvent having a boiling point of not less than 150° C. is at least one solvent selected from the group consisting of ethyl carbitol, butyl carbitol and butyl carbitol acetate.

It is preferable in the first and second manufacturing methods that the solvent having a boiling point of not more than 100° C. is one solvent selected from the group consisting of methyl ethyl ketone, isopropanol and toluene.

It is preferable in the first and second manufacturing methods that an additive selected from the group consisting of coupling agent, dispersing agent, coloring agent and tack free agent is further added to the sheet for a thermally conductive substrate.

It is preferable in the first and second manufacturing methods that the film forming method is at least one method selected from the group consisting of doctor blade method, coater method, and injection molding method.

The third method for manufacturing the thermally conductive substrate of the present invention comprises the steps of: piling up a lead frame on a face of the sheet for the thermally conductive substrate manufactured by the first manufacturing method; molding the sheet at a temperature below the hardening temperature of the thermosetting resin composition and at a pressure in the range of 10 to 200 Kg/cm$^2$; filling the sheet and integrating to the surface of the lead frame; and hardening the thermosetting resin by thermal pressing at the pressure in the range of 0 to 200 Kg/cm$^2$.

It is preferable in the third manufacturing method that a metal substrate for thermal radiation is further formed on the face opposite to the face to which the lead frame is adhered to the thermally conductive substrate.

Moreover, the third method for manufacturing the thermally conductive substrate of the present invention comprises the steps of: placing the lead frame and a printed circuit board having two or more wiring layers on the sheet for the thermally conductive substrate manufactured by the method in which the lead frame and the printed circuit board are not overlapped; molding the sheet at the temperature below the hardening temperature of the thermosetting resin composition and at the pressure in the range of 10 to 200 Kg/cm$^2$; filling the sheet and integrating to the surface of the lead frame and the printed circuit board having two or more wiring layers; and hardening the thermosetting resin by thermal pressing at the pressure of 0 to 200 Kg/cm$^2$.

Moreover, the third method for manufacturing the thermally conductive substrate of the present invention comprises a series of steps of: processing through holes on the sheet for the thermally conductive substrate manufactured by filling a conductive resin composition into the through holes; piling up the metallic foil on both sides of the sheet into which the conductive resin composition is filled in the through holes; hardening the thermosetting resin of the sheet by thermal pressing at the pressure of 10 to 200 Kg/cm$^2$; and forming wiring pattern by processing the metallic foil.

Moreover, the method for manufacturing the thermally conductive substrate of the present invention comprises the steps of: piling up a metallic foil on the both sides of the sheet for the thermally conductive substrate manufactured by hardening the thermosetting resin of the sheet of thermally conductive substrate by thermal pressing at the pressure of 10 to 200 Kg/cm$^2$; processing through holes on the hardened the thermally conductive sheet; conducting a copper plating on the entire surface of the sheet on which through holes are processed; and forming a wiring pattern by processing the metallic foil and the copper plating layer.

Moreover, the third method for manufacturing the thermally conductive substrate of the present invention comprises the steps of: preparing a desired number of thermally conductive substrates by the first manufacturing method; processing through holes at desired locations on each of the sheets; filling a conductive resin composition into the through holes; forming a wiring pattern on one surface of the filled sheet by using the conductive resin composition; piling up each of the sheet having the wiring pattern in a way in which the surface having the wiring pattern is adjusted to face upward and the sheet on which only the conductive resin composition is filled to the through hole is adjusted to be the top face to form a pile; piling up metallic foil on both sides of the pile; hardening the thermosetting resin of the sheet for the thermally conductive substrate by thermal pressing at the pressure of 10 to 200 Kg/cm$^2$; and forming a wiring pattern by processing the metallic foil.

It is in the third manufacturing method that the through holes are processed by the method selected from the group consisting of laser beam process, drilling process and punching process.

It is in the third manufacturing method that the metallic foil is a copper foil having a thickness of 12 to 200 μm and having faces at least one surface of which is a rough surface.

It is in the third manufacturing method that the conductive resin composition comprises 70 to 95 weight parts of at least one metallic powder selected from the group consisting of silver, copper and nickel; and 5 to 30 weight parts of thermosetting resin and hardener.

It is in this third manufacturing method that the temperature for the thermal pressing is in the range of 170 to 260° C.

As mentioned above, according to the present invention, high thermal radiation printed circuit wiring board for mounting electronic power devices can be made of the thermally conductive substrate by shaping and hardening the thermally conductive sheet into a desired shape. Shaping is possible due to the flexibility of the thermally conductive substrate sheet, hardening makes the thermally conductive substrate rigid.

Moreover, according to the present invention, thermally conductive substrate can be manufactured efficiently and reasonably.

The first embodiment of the present invention basically relates to a thermally conductive sheet having flexibility, where an inorganic filler is added into a thermosetting resin in the not-hardened state at high density; the coefficient of thermal expansion in the plane direction is approximately the same as that of Si semiconductor; and high thermal conductivity is provided. In the thermally conductive sheet of the present invention, a high boiling point solvent is added into the thermosetting resin composition, or a thermosetting resin mixture containing a solid resin that is solid at room temperature and a liquid thermosetting resin that is liquid at room temperature, and films are formed by using a low boiling point solvent for mixing with inorganic filler. Consequently, in the thermally conductive sheet of the present invention, inorganic filler can be added at a high filler loading. Furthermore, the flexibility of the thermosetting resin of the thermally conductive sheet is manufactured in the not-hardened state, and, thus, molding the thermally conductive sheet into a desired shape at a low temperature and at a low pressure is possible. In addition, the thermally conductive substrate can be made rigid by hardening the thermosetting resin by thermal pressing. Also, a thermally conductive substrate on which a semiconductor can be simply and directly mounted can be obtained by the use of this thermally conductive sheet which is flexible.

The second embodiment of the present invention relates to a thermally conductive substrate on which a semiconductor having thermal radiation property can directly be mounted by using the thermally conductive sheet; piling up a lead frame; and hardening the thermally conductive sheet by means of thermal pressing to integrate with the lead frame.

Moreover, the third embodiment of the present invention relates to a doubled-sided thermally conductive substrate having high thermal conductivity, which permits electrical conductivity on both sides by forming through holes on the thermally conductive sheet, filling the thorough holes with the conductive resin composition and forming metallic foil patterns on both sides of the sheet.

Moreover, the fourth embodiment of the present invention relates to a high thermally conductive double-sided substrate which permits electric conductivity by copper plating to the through holes of the third embodiment.

Moreover, the fifth embodiment of the present invention relates to a thermally conductive substrate (a multi-layered substrate) having a multi-layered circuit structure in which a plurality of the thermally conductive sheets are used, the through holes to which conductive resin composition is filled are formed, wiring pattern is formed on one side of the thermally conductive sheet, and a plurality of the thermally conductive sheets are piled up.

BRIEF DESCRIPTION OF DRAWINGS

FIGS. 6A to 6J are cross sectional views showing each step of a manufacturing process of the thermally conductive multi-layered wiring substrate of one embodiment of the present invention.

FIGS. 7A and 7B are cross sectional views showing each step of a manufacturing process of the thermally conductive substrate of another embodiment of the present invention.

DETAILED DESCRIPTION OF THE INVENTION

Hereinafter, the thermally conductive substrate (single-sided wiring substrate, double-sided wiring substrate, multi-layered wiring substrate) for mounting bare chip of one embodiment of the present invention will be explained by referring to figures.

Figure 1:
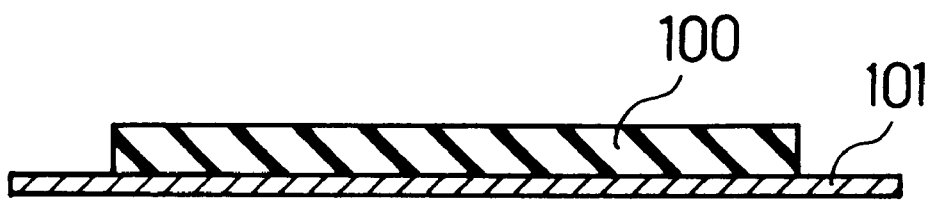
FIG. 1 is a cross sectional view showing a structure of the thermally conductive sheet of one embodiment of the present invention.

FIG. 1 is a cross sectional view showing a structure of the thermally conductive sheet of one embodiment of the present invention. In FIG. 1, a thermally conductive sheet 100 is formed on a tack free film 101. The forming method includes: preparing the slurry mixture which comprises at least one inorganic filler, thermosetting resin composition, a solvent having a boiling point of not less than 150° C. and a solvent having a boiling point of not more than 100° C.;

and forming the mixture into a film on the tack free film 101. The film forming method can be, for example, a doctor blade method, a coater method and an injection molding method can be employed. A thermally conductive sheet having flexibility can be obtained by drying only the solvent having a boiling point of not more than 100° C. of the film slurry.

Moreover, similarly, a thermally conductive sheet having flexibility can be obtained by the process comprising the steps of: preparing the slurry mixture which comprises at least one inorganic filler, a thermosetting resin composition that is solid at room temperature, and a solvent having a boiling point of not more than 100° C.; forming the slurry mixture into a film on the tack free film 101, similar to the above; and drying the solvent.

The examples of the thermosetting resin include, epoxy resin, phenol resin and cyanate resin. Moreover, the examples of the inorganic filler include $Al_2O_3$, MgO, BN, and AlN. The examples of the solvent having a boiling point of not less than 150° C. include ethyl carbitol, butyl carbitol and butyl carbitol acetate.

Moreover, the examples of the thermosetting resin that is liquid at room temperature include epoxy resin such as bisphenol A epoxy resin, bisphenol F epoxy resin and liquid state phenol resin.

In addition, the examples of the solvent having a boiling point of not more than 100° C. include methyl ethyl ketone, isopropanol and toluene. Moreover, if necessary, coupling agent, dispersing agent, coloring agent and tack free agent can be added as an additive into the thermally conductive sheet composition.

Moreover, as mentioned above, the half hardened or partially hardened sheet for the thermally conductive substrate having a moderated viscosity ($10^2$ to $10^5$ Pa·s) can be obtained by adding the solvent having a boiling point of not less than 150° C. or adding the thermosetting resin that is liquid at room temperature, and drying the solvent having a boiling point of not more than 100° C. If the viscosity is not more than $10^2$ Pa·s, the adhesion of the sheet is so strong that it is difficult to be peeled apart from the tack free film and furthermore changing the shapes after the process is large and the operation efficiency is bad. It is preferable that the viscosity is in the range of $10^3$ to $10^4$ Pa·s in the view of the operation efficiency and processing property.

Since high filler loading (ie., high filler content) in the thermally conductive substrate using this thermally conductive sheet is possible in the present invention, the coefficient of thermal expansion of the substrate can be made to be approximately the same as that of a semiconductor, and furthermore the substrate can be made to have excellent thermal radiation.

FIGS. 2A to 2E are cross sectional views showing each step of a manufacturing process of the thermally conductive substrate manufactured by using the thermally conductive sheet 100. In FIG. 2A, numeral 200 denotes the thermally conductive sheet manufactured by the above method; 201 of FIG. 2B denotes a lead frame forming a wiring. The lead frame 201 can be obtained by punching a copper plate into a desired shape, or can be formed by an etching method. A processed lead frame whose surface is plated with nickel prevent oxidation of copper is generally used.

FIG. 2C shows a structure in which the lead frame 201 and the thermally conductive sheet 200 are piled up.

FIG. 2D shows a structure in which the lead frame and thermally conductive sheet are thermally pressed. Then the thermally conductive sheet is filled to the surface of the lead frame by using the flexibility of the thermally conductive sheet. Finally, the thermosetting resin in the thermally conductive sheet is hardened. Then, FIG. 2E shows the hardened thermally conductive substrate in which the portion except the necessary portion of the lead frame of the thermally conductive substrate is cut. In FIG. 2E, the hardened thermally conductive substrate is bent perpendicularly so as to form a removable electrode. Thus, as described above, a thermally conductive substrate is manufactured. Subsequently, steps of mounting parts by soldering or filling insulating resin are carried out, but they are not important herein and omitted.

Figure 2:
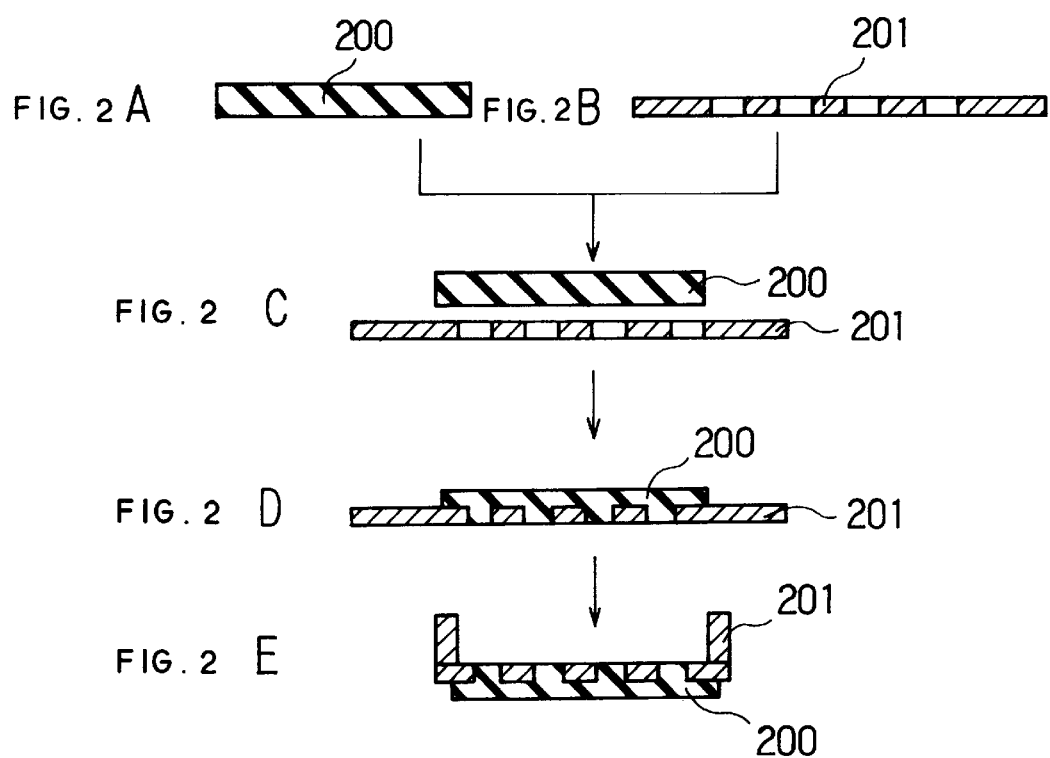
FIGS. 2A to 2E are cross sectional views showing each step of a manufacturing process of the thermally conductive substrate which is manufactured by using the thermally conductive sheet of one embodiment of the present invention.
Figure 3:
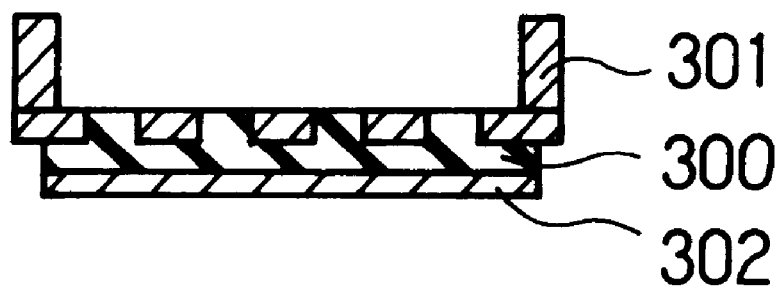
FIG. 3 is a cross sectional view of the thermally conductive substrate on which the thermal radiation metal substrate is further formed on the face opposite to face the lead frame is adhered to the thermally conductive substrate manufactured by the process according to FIG. 2.

FIG. 3 shows a structure in which the thermal radiation metal substrate 302 is further formed on the face opposite to the portion where the lead frame is adhered to the thermally conductive substrate manufactured by the steps illustrated in FIG. 2.

FIGS. 4A to 4F show the method for forming a thermally conductive substrate having a double-sided wiring, which is different from the above mentioned method. FIG. 4A shows the thermally conductive sheet 400 formed on the tack free film 401. In FIG. 4B, the through holes 402 is formed from the side of the tack free film 401 of the thermally conductive sheet 400. The formation of the through holes can be conducted by a laser processing method using carbon dioxide, excimer or the like, or by a metal molding process, or furthermore, by drilling. Punching by using laser beam is preferred, because punching holes at a fine pitch is possible and scrapings are not generated. In FIG. 4C, the conductive resin composition 403 is filled into the through hole 402. As a conductive resin composition, for example, a conductive paste formed by mixing copper powder, epoxy resin and hardener of epoxy resin can be used. In FIG. 4D, the metallic foils 404 are further piled up on both sides of the thermally conductive sheet. FIG. 4D is thermally pressed in this state, and the thermally conductive sheet is hardened as shown in FIG. 4E. Finally, the metallic foil applied onto both sides are processed as shown in FIG. 4F, and thereby the wiring pattern 405 can be obtained. Thus, the thermally conductive substrate having wiring patterns on both sides of the thermally conductive sheet can be obtained. At this time, the lead frame can be used instead of the metallic foil. In this case, the last step, namely, the step for forming wiring pattern can be omitted.

Figure 4:
FIGS. 4A to 4F are cross sectional views showing each step of a manufacturing process of the thermally conductive substrate which is manufactured by using the thermally conductive sheet of one embodiment of the present invention.
Figure 4:
Figure 4:
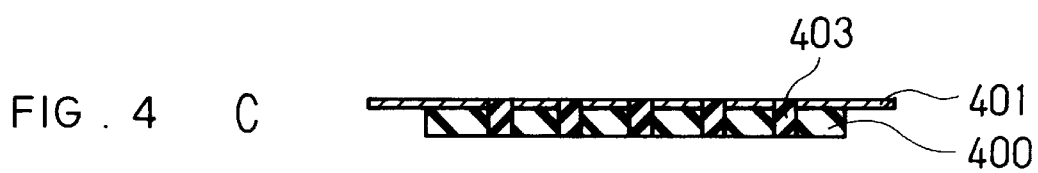
Figure 4:
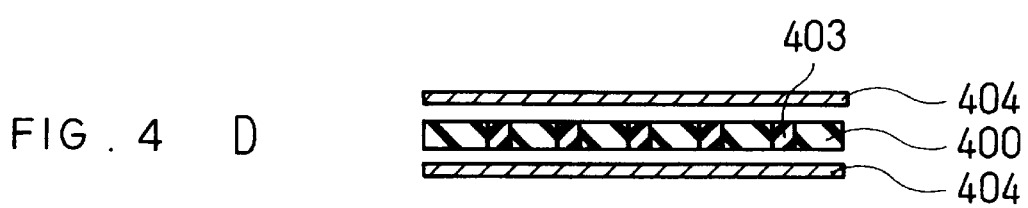
Figure 4:
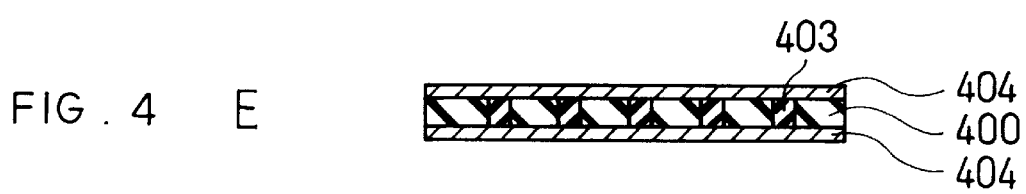
Figure 4:
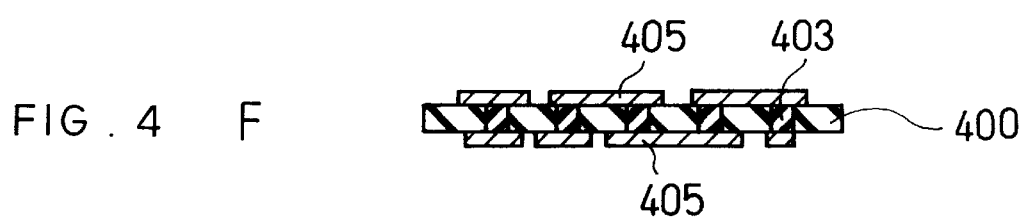
Figure 5:
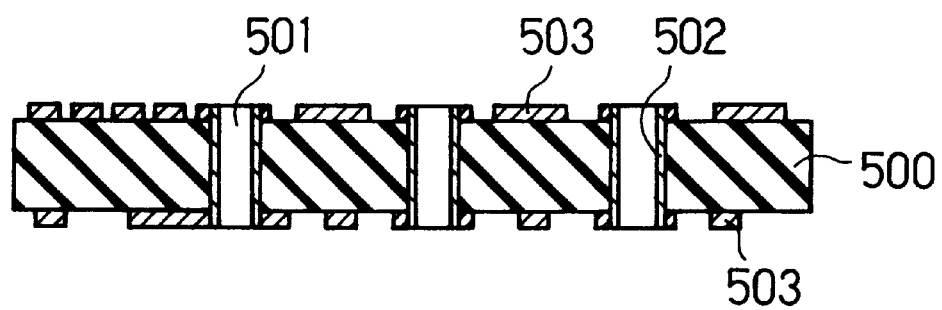
FIG. 5 is a cross sectional view showing a process for manufacturing the thermally conductive multi-layered wiring substrate of one embodiment of the present invention.

FIG. 5 is a cross sectional view of the thermally conductive substrate, where the method of electrically connecting both sides of the thermally conductive substrate manufactured by the process of FIG. 4 is conducted not by the use of conductive resin composition but by processing through holes after hardening by thermal pressing, followed by connecting the inside layers by the copper plating method. Numeral 501 denotes a copper plating layer formed on the inside surface of the through hole; 502 denotes a wiring pattern; and 500 denotes the thermally conductive substrate wherein the thermally conductive sheet is hardened.

FIG. 6 is a cross sectional view showing each step of a manufacturing process of a thermally conductive multi-layered wiring substrate of one embodiment of the present invention. FIGS. 6A to 6C are the same as the thermally conductive sheet shown in FIG. 4 where through holes are processed on the thermally conductive sheet and a conductive resin composition is filled into the through holes. FIGS. 6D, 6F and 6G show thermally conductive sheets into which the conductive resin composition 603 is filled and the conductive resin composition 603 is further used on one side thereof to produce wiring pattern 604. The method for forming the wiring pattern can be a screen printing method or a copper plate offset printing method or the like. In FIG. 6E, the wiring pattern by the conductive resin composition is not formed.

FIG. 6H is a pile where the thermally conductive sheets shown in FIGS. 6E to 6G are piled up as shown in the figure, and a metallic foil 605 is further piled up on the both sides of the pile. FIG. 6I shows a structure in which each thermally conductive sheet is laminated, hardened and adhered by thermal pressing. FIG. 6J shows a structure in which the wiring pattern of the top layer 606 is finally formed. The formation of the wiring pattern herein is carried out by an etching method. The etching method is wet etching, where ferric chloride is used as the etching reagent. Thus, a high density thermally conductive substrate having a multilayered wiring structure can be obtained.

Moreover, herein, in manufacturing the printed circuit board, there are steps of applying soldering resist, printing letters or marks and punching holes for inserting parts. For these steps, however, any conventional technique can be employed, and they are not important herein and therefore omitted.

FIGS. 7A and 7B are cross sectional views showing each step of a manufacturing process of the thermally conductive substrate manufactured by using the thermally conductive sheet 700. In FIG. 7A, numeral 700 denotes the thermally conductive sheet manufactured by the above method; 701 denotes a lead frame for forming wiring. The lead frame 701 can be obtained by punching a copper plate into a desired shape, or can be formed by an etching method. A processed lead frame whose surface is plated with nickel preventing oxidation of copper is generally used. Numeral 702 denotes the printed wiring circuit having two or more wiring layers and it has a via 704 for electrically connecting between the wiring pattern 703 and the layers.

FIG. 7B shows a structure in which the lead frame 701, thermally conductive sheet 700 and the printed wiring circuit 702 having two layers or more are thermally pressed; then the thermally conductive sheet is filled to the surface of the lead frame by using the flexibility of the thermally conductive sheet; and furthermore, the thermosetting resin in the thermally conductive sheet is hardened. Then, as in FIG. 2E, the hardened thermally conductive substrate in which the portion except the necessary portion of the lead frame of the thermally conductive substrate is cut, the hardened thermally conductive substrate is bent perpendicularly so as to form a removable electrode. Thus, a thermally conductive substrate is manufactured. Subsequently, steps of mounting parts by soldering or filling insulating resin are carried out, but they are not important herein and omitted.

Hereinafter, the present invention will be explained by referring to Examples.

EXAMPLE 1

In the formation of the thermally conductive sheet of the present invention; inorganic filler, thermosetting resin and solvent were mixed, and alumina balls were further added into the above mixture so as to obtain a sufficient dispersion. The compositions of the thermally conductive sheet of this Example are shown in Table 1.

TABLE 1

| Experiment No. | Inorganic Filler | | Thermosetting resin (including hardner) | | Solvent having a boiling point of not more than 150° C. | | Other additives | | | Sheet after dried |
| --- | --- | --- | --- | --- | --- | --- | --- | --- | --- | --- |
| | Name | Vol. (wt %) | Name | Vol. (wt %) | Name | Vol. (wt %) | *1 | *2 | *3 | Viscosity (Pa · s) |
| 1a | $Al_2O_3$ | 60 | Epoxy resin | 36 | Butyl calbitol acetate (BCA) | 4 | — | — | — | $1.5 \times 10^2$ |
| 1b | $Al_2O_3$ | 70 | Epoxy resin | 28 | | 2 | — | — | — | $3.3 \times 10^3$ |
| 1c | $Al_2O_3$ | 80 | Epoxy resin | 18 | | 2 | — | — | — | $2.6 \times 10^4$ |
| 1d | $Al_2O_3$ | 90 | Epoxy resin | 9.5 | | 0.5 | — | — | — | $8.1 \times 10^4$ |
| 1e | $Al_2O_3$ | 95 | Epoxy Resin | 4.9 | | 0.1 | — | — | — | $1.3 \times 10^5$ |

*1: coloring agent
*2: coupling agent
*3: dispersing agent

Table 1 shows an evaluation of the performance of the thermally conductive sheet when the content of $Al_2O_3$ as an inorganic filler is changed. As $Al_2O^3$, "AL-33" having a particle diameter of 12 μm on the average, the product of Sumitomo Chemical Company Limited was used; and as an epoxy resin, the epoxy resin comprising the following composition was used: 1) thermosetting resin main agent: 65 weight parts of brominated multifunctional epoxy resin (5049-B-70, the product of Yuka-shell epoxy Co., Ltd.); 2) hardener: 34.4 weight parts of bisphenol A novolak resin (152, the product of Yuka-shell epoxy Co., Ltd.); and 3) hardening accelerator: 0.6 weight parts of imidazol (EMI-12, the product of Yuka-shell epoxy Co., Ltd.). This resin composition was in a solid state and it was softened to a paste-like consistence by adding methyl ethyl ketone. The content in the state of solid was 70%.

First, the resin compositions in Table 1 were weighed. Then, methyl ethyl ketone solvent, having a boiling point of not more than 100° C. for adjusting the viscosity, was added to the compositions until the viscosity of the slurry became about 20 Pa·s. Subsequently, the alumina balls were added and mixed thereof in a pot with a rotating at a speed of 500 rpm for 48 hours. At this time, the low boiling point solvent was used so as to adjust the viscosity of the alumina ball filled slurry. Maintaining a low slurry-like viscosity by this slurry is important for adding an inorganic filler in a high concentration in the slurry. However, the low boiling point solvent was volatilized in the following drying step. Since no low boiling point solvent remained in the thermally conductive sheet composition, it is not included in Table 1. Next, a polyethylene terephthalate sheet having a thickness of 75 μm was prepared as the tack free surface and the above mentioned slurry was spread out into a film by the doctor blade method with a gap of approximately 1.4 mm. Then, methyl ethyl ketone in the above mentioned film was dried by allowing the film to stand at 100° C. for an hour. Thereby, as shown in Table 1, the flexible thermally conductive sheet (the thickness was 750 μm) having a moderate viscosity was obtained.

From the thermally conductive sheet manufactured like this, the tack free film of polyethylene terephthalate film was peeled apart. Then, the thermally conductive sheet was again covered with a thermal resistance tack free film (PPS: polyphenylene sulfite having a thickness of 75 μm), and was hardened at the temperature of 200° C. and at the pressure of 50 Kg/cm$^2$. The PPS tack free film was peeled apart and the thermally conductive sheet was processed into a predetermined shape and size. The thermal conductivity, coefficient of thermal expansion, break down voltage and flexural strength were measured. The results are shown in Table 2.

TABLE 2

Evaluation of thermally conductivity substrate

| Experiment No. | Thermal Conductivity (W/mK) | Thermal Expansion (ppm/° C.) | Break Down Voltage (kV/mm) | Flexural Strength (Kg/mm$^2$) |
| --- | --- | --- | --- | --- |
| 1a | 1.1 | 28 | 15 | 9.5 |
| 1b | 1.2 | 24 | 14 | 12.3 |
| 1c | 1.9 | 18 | 15 | 15.5 |
| 1d | 3.5 | 10 | 12 | 18.8 |
| 1e | 4.1 | 8 | 9 | 13.1 |

The thermal conductivity was defined by calculating the temperature transmitted from one surface to another surface of the sample that was cut into 10 mm in size, when the sample was heated by bringing it into contact with a heater. Similarly, the break down voltage by AC voltage shown in Table 2 was defined by measuring the break down voltage in the direction of the thickness of the thermally conductive substrate and calculating the value per a unit thickness. The break down voltage is affected by the adhesion between the thermosetting resin and the inorganic filler in the thermally conductive substrate. In other words, if the wettability of the inorganic filler and the thermosetting resin was bad, micro gaps were generated between them. As a result, the strength of the substrate and break down voltage are deteriorated. In general, the break down voltage of a resin alone is approximately 15 KV/mm. If the break down voltage is not less than 10 KV/mm, it is judged that the adhesion between the thermosetting resin and the inorganic filler is excellent.

From the results in Tables 1 and 2, the thermally conductive substrate obtained by the thermally conductive sheet manufactured by the above mentioned method had about 20 times as much thermal conductivity as the conventional glass epoxy substrate, and not less than 2 times as high a performance as the thermally conductive sheet manufactured by the conventional injection molding method. In addition, as to the coefficient of thermal expansion, when the thermally conductive sheet contained not less than 90 wt. % of $Al_2O_3$, the coefficient of thermal expansion was similar to that of a silicon semiconductor. Moreover, the flexural strength of the substrate was not less than 15 Kg/mm$^2$, exhibiting sufficient strength as substrate. Therefore, the thermally conductive substrate of the present invention is promising as a substrate for a flip chip on which a semiconductor is directly mounted.

Then, the performance was evaluated when the type of inorganic filler was changed. The compositions are shown in Table 3 and the evaluation results are shown in Table 4.

TABLE 3

| Experiment No. | Inorganic Filler | | Thermosetting resin (including hardner) | | Solvent having a boiling point of not more than 150° C. | | Other additives | | | Sheet after dried |
| --- | --- | --- | --- | --- | --- | --- | --- | --- | --- | --- |
| | Name | Vol. (wt %) | Name | Vol. (wt %) | Name | Vol. (wt %) | *1 | *2 | *3 | Viscosity (Pa · s) |
| 1f | $Al_2O_3$ | 91 | Epoxy resin | 8 | Butyl calbitol | 0.5 | 0.3 | 0.2 | — | 3.1 × 10$^4$ |
| 1g | AlN | 85 | Epoxy resin | 14 | acetate (BCA) | 0.5 | 0.3 | 0.2 | — | 1.6 × 10$^4$ |
| 1h | AlN | 90 | Epoxy resin | 9 | | 0.5 | 0.3 | — | 0.2 | 5.8 × 10$^4$ |
| 1I | BN | 80 | Epoxy resin | 19 | | 0.5 | 0.3 | 0.2 | — | 7.1 × 10$^3$ |
| 1j | MgO | 87 | Epoxy | 12 | | 0.5 | 0.3 | 0.2 | — | 6.4 × 10$^4$ |

*1: coloring agent (wt. %)
*2: coupling agent (wt. %)
*3: dispersing agent (wt. %)

TABLE 4

Evaluation of Thermal Conductive Substrate

| Experiment No. | Thermal Conductivity (W/mK) | Thermal Expansion (ppm/° C.) | Break Down Voltage (kV/mm) | Flexural Strength (Kg/mm$^2$) |
|---|---|---|---|---|
| 1f | 3.7 | 9 | 11 | 18.5 |
| 1g | 4.0 | 11 | 14 | 15.3 |
| 1h | 7.4 | 7.5 | 12 | 13.6 |

TABLE 5

| Experiment No. | Inorganic Filler | | Thermosetting resin that is Solid at room Temperature | | Thermosetting resin that is liquid at room Temperature | | Hardener | | Other additives | | Sheet after dried (Pa · s) |
|---|---|---|---|---|---|---|---|---|---|---|---|
| | Name | Vol. (wt. %) | Name | Vol. (wt. %) | Name | Vol. (wt. %) | Name | Vol. (wt. %) | Name | Vol. (wt. %) | |
| 1k | Al$_2$O$_3$ | 89.5 | Epoxy resin | 9 | bis F | 1 | Sl-100 | 0.2 | Raven 1060 | 0.3 | $3.1 \times 10^5$ |
| 1l | Al$_2$O$_3$ | 89.5 | Epoxy resin | 8 | bis F | 2 | Sl-100 | 0.2 | Raven 1060 | 0.3 | $1.3 \times 10^4$ |
| 1m | Al$_2$O$_3$ | 89.5 | Epoxy resin | 6 | bis F | 4 | Sl-100 | 0.2 | Raven 1060 | 0.3 | $4.4 \times 10^3$ |
| 1n | Al$_2$O$_3$ | 89.5 | Epoxy resin | 4 | bis F | 6 | Sl-100 | 0.2 | Raven 1060 | 0.3 | $2.1 \times 10^2$ |
| 1o | Al$_2$O$_3$ | 89.5 | Epoxy resin | 6 | bis A | 4 | Sl-100 | 0.2 | Raven 1060 | 0.3 | $6.7 \times 10^4$ |
| 1p | Al$_2$O$_3$ | 89.5 | Epoxy resin | 6 | phenol | 4 | Sl-100 | 0.2 | Raven 1060 | 0.3 | $3.9 \times 10^3$ |

Bis F: bisphenol F epoxy resin (806, the product of Yuka-Shell Epoxy)
Bis A: bisphenol A epoxy resin
Phenol: liquid state phenol resin (110, the product of Cemedyne Co., Ltd.)
Hardener Sl-110: San-aid (the product of Sanshin Kagaku Co., Ltd.)
Coloring agent: carbon black (Raven 1060, the product of Colombia Carbon Japan Co., Ltd.)

TABLE 4-continued

Evaluation of Thermal Conductive Substrate

| Experiment No. | Thermal Conductivity (W/mK) | Thermal Expansion (ppm/° C.) | Break Down Voltage (kV/mm) | Flexural Strength (Kg/mm$^2$) |
|---|---|---|---|---|
| 1I | 3.5 | 12 | 15 | 10.9 |
| 1j | 4.2 | 19 | 10 | 12.0 |

As is apparent from Tables 3 and 4, if a powder other than Al$_2$O$_3$, for example, AlN, MgO, BN (approximately 7 to 12 μm) was used as the inorganic filler, the performance peculiar to the inorganic filler was exhibited. In other words, if AlN having excellent thermal conductivity was used, then the thermal conductivity similar to that of the ceramic substrate was obtained (Example 1h). Moreover, in a case where BN was added, then high thermal conductivity and low thermal expansion property was obtained as shown in Example 1i. At this time, the additives content was determined in a way in which a suitable state could be obtained in accordance with the density and dispersion of inorganic fillers. More inorganic fillers can be added by adding dispersing agents such as AlN. Moreover, the thermally conductive substrate having a sufficient thermal radiation property could be obtained by coloring the thermally conductive sheet. Moreover, as mentioned above, the addition of silane coupling agent for improving the adhesion between the organic filler and the thermosetting resin also improves the break down voltage characteristics of the thermally conductive sheet.

In Table 5, the performance of the thermally conductive sheet was evaluated in a case where Al$_2$O$_3$ was used as the inorganic filler and resin that is liquid at room temperature was added for providing flexibility. As Al$_2$O$_3$, "AL-33" (the product of Sumitomo Chemical Company Limited) having an average particle diameter of 12 μm, was used; and an epoxy resin was obtained by substituting a part of NVR-1010 containing a hardener (the product of Japan REC Co., Ltd.) by liquid resin shown in Table 5.

First, the compositions in Table 5 were weighed. Then, methyl ethyl ketone solvent, having a boiling point of not more than 100° C. for adjusting the viscosity, was added to the compositions until the viscosity of the slurry became about 20 Pa·s. Subsequently, the alumina balls were added and mixed thereof in a pot with a mixing device rotating at a speed of 500 rpm for 48 hours. At this time, the low boiling point solvent was used to adjust the viscosity of the alumina balls filled slurry. Maintaining a low slurry-like viscosity by the slurry is important for adding an inorganic filler in a high concentration in the slurry. However, the low boiling point solvent was volatilized in the following drying step. Since no low boiling point solvent remained in the thermally conductive sheet composition, it is not included in Table 1. Next, a polyethylene terephthalate sheet having the thickness of 75 μm was prepared as the tack free surface and the above mentioned slurry was spread out into a film by the doctor blade method with a gap of approximately 1.4 mm. Then, methyl ethyl ketone in the above mentioned film was dried by allowing to stand at 100° C. for an hour. Thereby, as shown in Table 5, the flexible thermally conductive sheet (the thickness was 750 μm) having a moderate viscosity was obtained by adding a resin that is liquid at room temperature.

From the thermally conductive sheet manufactured like this, the tack free film of polyethylene terephthalate film was peeled apart. Then, the thermally conductive sheet was again covered with a thermal resistance tack free film (PPS: polyphenylene sulfite having a thickness of 75 μm), and was hardened at the temperature of 200° C. and at the pressure of 50 Kg/cm². The PPS tack free film was peeled apart and the thermally conductive sheet was processed into a predetermined shape and size. The thermal conductivity, coefficient of thermal expansion, break down voltage and flexural strength were measured. The results are shown in Table 6.

TABLE 6

| | Evaluation of thermally conductivity substrate | | | |
|---|---|---|---|---|
| Experiment No. | Thermal Conductivity (W/mK) | Thermal Expansion (ppm/° C.) | Break Down Voltage (kV/mm) | Flexural Strength (Kg/mm²) |
| 1k | 3.6 | 14 | 12 | 11.3 |
| 1l | 3.7 | 13 | 14 | 13.5 |
| 1m | 3.9 | 13 | 14 | 15.5 |
| 1n | 4.1 | 15 | 15 | 17.8 |
| 1o | 3.6 | 14 | 15 | 14.3 |
| 1p | 3.9 | 13 | 15 | 18.9 |

As is apparent from Table 6, flexibility could be provided to the thermally conductive sheet by adding the resin that was liquid at room temperature. Moreover, the performance peculiar to inorganic filler was exhibited. As compared with the method of the above mentioned Example where a high boiling point solvent was added, the break down voltage by void and the flexural strength were excellent, because no solvent existed in the sheet at the time of molding the thermally conductive sheet.

EXAMPLE 2

In this Example, a thermally conductive substrate in which the thermally conductive sheet was manufactured by the same method as in Example 1 and integrated with a lead frame will be explained. The compositions of the thermally conductive sheet used in this Example will be described hereinafter.

(1) Inorganic filler: 90 weight % of $Al_2O_3$, "AS-40®" (the product of SHOWA DENKO K.K.) having a spherical shape and an average particle size of 12 µm.

(2) Thermosetting resin: 9 weight % of cyanate ester resin, "AroCy M30®" (the product of Asahi-Ciba CO., Ltd.)

(3) Solvent having a boiling point of not less than 150° C.: 0.5 weight % of butyl carbitol. (the first grade of chemical reagent of Kanto Chemical CO, Inc.).

(4) Other additives: 0.3 weight % of "Carbon Black" (the product of Toyo-carbon CO., Ltd.), and 0.2 wt. % of dispersing agent, "PLYSURF F-208F®" (the product of DAI-ICHI SEIYAKU KOGYO CO.,LTD.).

A thermally conductive sheet (a thickness was 770 µm) comprising the above mentioned compositions was used. As the lead frame, a copper plate having a thickness of 500 µm which was processed by the etching method and further applied with nickel plating was piled up and thermally pressed at the temperature of 110° C. and pressed at the pressure of 60 Kg/cm². By such a process, the thermally conductive sheet flowed into gaps of the lead frame and was filled to the surface of the lead frame to form a structure as shown in FIG. 2D. Then, the thermally conductive sheet with which the lead frame was integrated was heated by a drier at 175° C. for one hour, and thermosetting resin of the thermally conductive sheet was hardened. Such process could be conducted for a short time by only conducting the molding at low temperature, and the hardening could be conducted as a whole after molding, so that mass treatment in a short time was realized as an entire process. Moreover, as shown in FIG. 2E, the outer circumference of the lead frame was cut and the bending of the terminal was conducted, to thus completely form the thermally conductive substrate. Moreover, in the above, the molding process and the hardening process were separately conducted. However, a series of process from thermal molding with pressing to hardening could be continuously conducted.

When the thermal conductivity of the thermally conductive substrate obtained as above was evaluated, the value was 3.7 W/mK. Consequently, about 2 times as high a performance as that of a conventional injection molding method or metal substrate could be realized. Moreover, for the evaluation of reliability, a reflow test was conducted at the maximum temperature of 260° C. for 10 seconds. At this time, there were no abnormalities at the interface between the substrate and lead frame, thus indicating a strong adhesion at the interference.

EXAMPLE 3

In this Example, a thermally conductive substrate will be explained, where the thermally conductive sheet was manufactured by the same method as in Example 1 and both sides of the sheet had metallic foil wiring layers and conductive resin composition was filled between the layers to electrically connect the layers. The compositions of the thermally conductive sheet used in this Example will be described hereinafter.

(1) Inorganic filler: 90 weight % of $Al_2O_3$, "AS-40®" (the product of SHOWA DENKO K.K.) having a spherical shape and an average particle size of 12 µm.

(2) Thermosetting resin: 9 weight % of "NRV-1010®" (the product of Japan REC CO., Ltd.), a mixture comprising 60 weight parts of brominated multifunctional epoxy resin as a main agent, 39.5 weight parts of bisphenol A nobolak resin as a hardener, and 0.5 weight parts of imidazol as a hardening accelerator.

(3) Solvent having a boiling point of not less than 150° C.: 0.5 weight % of butyl carbitol (the first grade chemical reagent of Kanto Chemical Co, Inc.).

(4) Other additives : 0.3 weight % of "Carbon Black" (the product of Toyo-carbon CO., Ltd., and 0.2 wt. % of coupling agent, "Plen-act KR-55®" (the product of AJINOMOTO CO., INC).

A thermally conductive sheet having the tack free film manufactured from the above mentioned compositions and was cut into a predetermined size with through holes having a diameter of 0.15 mm punched in it by the use of carbon dioxide laser. The through holes were equally spaced at a pitch of 0.2 to 2 mm from the surface of the tack free film (FIG. 4B).

A conductive resin composition for filling via hole 403, containing 85 wt. % of spherical shaped copper metal powder, 3 wt. % of bisphenol A epoxy resin (Epikote 828, the product of Yuka-shell epoxy Co., Ltd.) as the resin composition , 9 wt. % of glycidyl ester system epoxy resin (YD-171, the product of Tohto Kasei Co., Ltd.), and 3 wt. % of amine adducts hardener (MY-24, the product of AJINOMOTO CO.,INC) were kneaded with three rolls, and filled in the through holes by the screen printing method (FIG. 4C). After the polyethylene terephthalate film 401 was removed from the thermally conductive sheet to which the paste was filled, a copper foil having a thickness of 35 µm and a rough surface on one surface was adhered in a way in which the rough surface facing the side of the thermally conductive sheet. Subsequently, the thermally conductive sheet was thermally pressed at the pressing temperature of 180° C. and at the pressure of 50 kg/cm² for 60 minutes to form a double-sided thermally conductive substrate (FIG. 4E).

By such a process, epoxy resin of the thermally conductive sheet was hardened and a strong adhesion to the rough surface of the copper foil was obtained. At the same time, epoxy resin in the conductive resin composition 403 was also hardened and mechanically and electrically connected with both sides of the copper foil through the inner via hole connection.

The copper foil of this double-sided copper plated board was etched by means of an etching technique and a double sided wiring substrate, having a circuit on which an electrode pattern and a wiring pattern with a diameter of 0.2 mm were formed on the inner via holes, was obtained. When the thermal conductivity and the coefficient of thermal expansion of the thermally conductive substrate manufactured by this method were measured, the thermal conductivity was 4.1 W/mK and the coefficient of thermal expansion for the temperature ranges from room temperature to 150° C. was 10 ppm/° C., thus, exhibiting excellent properties. The flip chip mounting of a semiconductor was conducted by using this thermally conductive substrate. The method includes: forming Au bump on the electrode of the semiconductor device by the conventional wire bonding method; applying adhesives containing Ag—Pd as the conductive materials on the top of this bump; bonding to the electrode pattern that was formed on the double-sided thermally conductive substrate by the flip chip method in which the surface of the semiconductor device was faced downward; hardening; and further mounting with molding resin. On the double-sided thermally conductive substrate the semiconductor manufactured as mentioned above was mounted, a reflow test was conducted 20 times at a maximum temperature of 260° C. for 10 seconds. At this time, the change in the electrical resistance value including that of connection between the substrate and semiconductor was very small. That is, the initial connecting resistance was 35 m Ω/bump and the connecting resistance after the test was 40 m Ω/bump.

In comparison, in a conventional glass epoxy substrate on which the through holes were provided at 2 mm intervals, the resistance at the bonding portion between the semiconductor and the substrate was increased, because the coefficient of thermal expansion of semiconductor was different from that of the substrate, so that the reflow test ended at ten times. On the other hand, the substrate of the present invention has a coefficient of thermal expansion in the plane direction of the substrate that is similar to that of a semiconductor. Thus, the change in the resistance value as a function of the numbers of reflow tests was small.

EXAMPLE 4

In this Example, a thermally conductive substrate, wherein the thermally conductive sheet was manufactured by the same method as in Example 1, both sides of the sheet have a metallic foil wiring layers and through hole copper plating was filled between the layers to electrically connect the layers, will be explained. The compositions of the thermally conductive sheet used in this Example will be described hereinafter.

(1) Inorganic filler: 87 weight % of $Al_2O_3$, "AM-28®" (the product of SHOWA DENKO K.K.) having a spherical shape and an average particle size of 12 μm.
(2) Thermosetting resin: 11 weight % of phenol resin, "Phenolite VH4150®" (the product of DAINIPPPON INK AND CHEMICALS, INC.)
(3) Solvent having a boiling point of not less than 150° C.: 1.5 weight % of ethyl carbitol (the first grade chemical reagent of Kanto Chemical Co, Inc.). (4) Other additives: 0.3 weight % of "Carbon Black" (the product of Toyo-carbon CO., Ltd.), and 0.2 wt. % of coupling agent, "Plen-act, KR-55®" (the product of AJINOMOTO CO., INC)

After the tack free film was peeled off from the thermally conductive sheet which was manufactured by using the above mentioned compositions, this thermally conductive sheet was cut into a predetermined size. A copper foil having a thickness of 35 μm and a rough surface on one side was adhered to the thermally conductive sheet in a way in which the rough surface was faced to the side of the thermally conductive sheet. Then this structure was thermally pressed for 60 minutes at 180° C. and at the pressure of 50 kg/cm² to form a double-sided thermally conductive substrate.

By such a process, phenol resin in the thermally conductive sheet was hardened to form the strong adhesion between the rough surface of the copper foil and the thermally conductive sheet. Processing through holes, having a diameter of 0.3 mm and by using the drill was conducted on the thermally conductive substrate on which the copper foil was adhered. Moreover, a 20 μm thick copper plating was applied to the entire surface including the through holes. The copper foil of this double-sided copper plated thermally conductive substrate was etched by an etching technique, and thereby a double sided substrate, on which a wiring pattern can be formed, was obtained (FIG. 5). The thermal conductivity and the coefficient of thermal expansion of the thermally conductive substrate manufactured by this method were measured and the thermal conductivity and the coefficient of thermal expansion in the temperature ranges from room temperature to 150° C. were formed to be 2.8 W/mK and 18 ppm/° C., and thus, exhibiting excellent properties.

EXAMPLE 5

Here, an example of the multi-layered wiring thermally conductive substrate will be explained. A plurality of the thermally conductive sheets manufactured by the same method as in Example 1 were used. Wiring layers were provided to the plurality of the layers of the thermally conductive sheets and they were electrically connected to the thermally conductive sheets by using a conductive resin composition. The composition of the thermally conductive sheet used in this Example will be described hereinafter.

(1) Inorganic filler: 92 weight % of $Al_2O_3$, "AM-28®" (the product of SHOWA DENKO K.K.) having a spherical shape and an average particle size of 12 μm.
(2) Thermosetting resin: 7.3 weight % of cyanate ester resin, "BT2170®" (the product of the Mitsubishi Gas Chemical Company, Inc.)
(3) Solvent having a boiling point of not less than 150° C.: 0.2 weight % of ethyl carbitol (the first grade chemical reagent of Kanto Chemical CO, Inc.).
(4) Other additives: 0.3 weight % of "Carbon Black" (the product of Toyo-carbon CO., Ltd.) and 0.2 wt. % of coupling agent "Plen-act, KR-55®," (the product of AJINOMOTO CO., INC).

A thermally conductive sheet 600 comprising the above mentioned compositions and having a tack free film polyethylene terephthalate 601 was used. From the side of the polyethylene terephthalate film, which is on one side of this thermally conductive sheet, through holes 602 having a diameter of 0.15 mm were formed at an equal spaced pitch of 0.2 to 2 mm by the use of a carbon dioxide laser (FIG. 6).

A conductive resin composition 603 containing 85 wt. % of copper metal spherical shaped powder, 3 wt. % of bisphenol A epoxy resin (Epikote 828, the product of Yuka-shell epoxy Co., Ltd.) as the resin composition, 9 wt. % of glycidyl ester system epoxy resin (YD-171, the product of Tohto Kasei Co., Ltd.) and 3 wt. % of amine adducts hardener (MY-24, the product of AJINOMOTO CO.,INC) as a hardener was kneaded by three rolls and filled in the through hole 602 by the screen printing method.

Moreover, the tack free film 601 was peeled apart. A conductive resin composition for forming wiring pattern containing 80 wt. % of the needle-like Ag powder, 10 wt. % of bisphenol A epoxy resin (Epikote 828, the product of Yuka-shell epoxy Co., Ltd.) as the resin composition, 2 wt. % of amine adducts hardener (MY-24, the product of AJINOMOTO CO.,INC) as the hardener, and 8 wt. % of turpentine oil as a solvent, was kneaded by three rolls and filled to the portion where the tack free film 601 was peeled apart by the screen printing method (FIG. 6D). Two other thermally conductive sheets on which wiring patterns were formed were prepared by the similar process (FIG. 6F and 6G). In addition, by the same method, a thermally conductive sheet, where the conductive resin composition 603 was filled in the through holes 602 (FIG. 6E), was prepared and piled up in a way in which the thermally conductive sheet was made to be at the top by adjusting places as shown in FIG. 6H. Onto the outer most layer, a copper foil of 18 µm thickness and having a rough surface on one side. The laminate of this thermally conductive sheet was thermally pressed for 60 minutes at a temperature of 180° C. and a pressure of 50 Kg/cm² to form a multi-layered thermally conductive substrate.

The copper foil of the multi-layered thermally conductive substrate was etched by an etching technique to form a wiring pattern. Since this multi-layered thermally conductive substrate used copper foil for the outer most layer portion, mounting of parts by means of soldering was possible. Moreover, on an inner layer, a wiring pattern was formed by the screen printing method. A line having a width of about 50 µm and inner via holes could be formed by a conductive resin composition. Thus, a high density wiring was possible, which makes this multi-layered thermally conductive substrate very promising as a substrate for mounting high density electrical circuits. When the thermal conductivity and the coefficient of thermal expansion of the thermally conductive substrate manufactured by this method were measured, the thermal conductivity was 4.5 W/mK and the coefficient of thermal expansion in the temperature range from room temperature to 150° C. was 8 ppm/° C., thus, showing good results.

Then, similar to the above, by using the flip chip mounting of a semiconductor, the thermally conductive substrate was evaluated as a multi-chip module. The method includes: forming Au bump on the electrode of the semiconductor device by the conventional wire bonding method; applying adhesives containing Ag—Pd as the conductive material on the top of this bump; bonding to the electrode pattern formed on the thermally conductive substrate by a flip chip method in which the surface of the semiconductor device was faced downward; hardening; and mounting with molding resin. On the thermally conductive substrate semiconductor was mounted, and a reflow test was conducted 20 times at a maximum temperature of 260° C. for 10 seconds. At this time, the change in the electrical resistance value including that of the bonding between the substrate and semiconductor was recognized to be very stably small. That is, the initial connecting resistance of 34 m Ω/bump was only changed to 37 m Ω/bump after the test.

In addition, when the certain current was flowed to the mounted semiconductor chip through the substrate of the present invention and 1 W of heat was continuously generated, the change of the electrical resistance value including that of the bonding between substrate and semiconductor was measured. In the substrate of the present invention, the change in the resistance value was insignificant in respective of the number of inner via holes.

Moreover, in the above mentioned Examples 1 to 5, copper and silver particles were used as the conductive filler in the conductive resin composition. However, in the present invention, the conductive particles are not limited to copper particles and other metal particles can be used. In particular, when nickel is used, a high electric conductivity in the conductive portion can be maintained.

As mentioned above, the thermally conductive sheet of the present invention can be used for a thermally conductive substrate, where an inorganic filler can be added at a high filler content into a thermosetting resin which is in the not-hardened state; the coefficient of thermal expansion in the plane direction is approximately the same as that of a semiconductor; and the high thermal conductivity can be provided. In the thermally conductive sheet of the present invention, a high boiling point solvent can be added or a thermosetting resin that is liquid at room temperature can be used. In the thermally conductive sheet of the present invention, an inorganic filler can be added at a high fiber content while flexibility of the thermosetting resin in the thermally conductive sheet is maintained in the not-hardened state, and molding the thermally conductive sheet into a desired shape at low temperature and low pressure is possible. In addition, a substrate can be made rigid by hardening the thermosetting resin by a thermal pressing. The thermally conductive substrate on which a semiconductor can be simply and directly mounted can be obtained by the use of this flexible, thermally conductive sheet. Furthermore, in a thermally conductive sheet in which the above mentioned thermally conductive resin was mixed with a thermosetting resin that is liquid at room temperature there existed no solvent in the sheet since the drying of the solvent of not more than 100° C. had already been completed. Therefore, when this sheet is heated and hardened, voids are not generated. Consequently, its thermal conductivity is excellent and insulating property is also excellent.

The thermally conductive substrate of the present invention can realize a thermally conductive substrate on which a semiconductor having thermal radiation property can directly be mounted by using the thermally conductive sheets by piling up a lead frame, and hardening the thermally conductive sheet by means of thermal pressing to integrate with the lead frame.

Moreover, the thermally conductive substrate of the present invention can realize a doubled-sided thermally conductive substrate having a high thermal conductivity. This structure permits electrical conductivity on both sides by forming through holes in the thermally conductive sheet, and filling the thorough holes with a conductive resin composition. Then, metallic foil patterns can be formed on both sides of the sheet.

Moreover, the thermally conductive substrate of the present invention can realize a high thermally conductive double-sided substrate which permits electric conductivity by copper plating to the through holes of the third embodiment.

Moreover, the thermally conductive substrate of the present invention can realize a thermally conductive substrate which is a multi-layered substrate having a multilayered circuit structure in which a plurality of the thermally conductive sheets are used, through holes to which conductive resin composition is filled are formed, a wiring pattern is formed on one side of the thermally conductive sheet and a plurality of the thermally conductive sheets are piled up.

As mentioned above, since the thermally conductive substrate (the substrate having a single-sided wiring structure, double-sided wiring structure, and multi-layered wiring structure) using the thermally conductive sheet of the present invention can be filled with an inorganic filler at a high filler content, it has high thermal conductivity that cannot be obtained in the case where the usual printed circuit board is used. Moreover, since the thermally conductive sheet has flexibility and can be molded and processed into any shape, the substrate can be manufactured by a simple process. This case of manufacturing is extremely effective from an industrial viewpoint. Furthermore, the hardened substrate is rigid and mechanically strong, and it has the thermal conductivity and the coefficient of thermal expansion equal to that of a semiconductor. Therefore, the thermally conductive substrate of the present invention is a promising material for using as a power circuit substrate, which will be increasingly used in the future, or as a substrate for mounting a digital high speed signal processing LSI in which there occurs a loss of high power. In addition, it is effective as a multi chip module (M&M) or chip size package (SP) for mounting flip chip where the semiconductors are directly mounted.

Finally, it is understood that the invention may be embodied in other specific forms without departing from the spirit or essential characteristics thereof. The embodiments disclosed in this application are to be considered in all respects as illustrative and not restrictive, so that the scope of the invention being indicated by the appended claims rather than by the foregoing description, and all changes which come within the meaning and range of equivalency of the claims are intended to be embraced therein.

What is claimed is:

1. A sheet mixture for a thermally conductive substrate comprising 70 to 95 weight parts of an inorganic filler and 5 to 30 weight parts of a thermosetting resin composition comprising at least one thermosetting resin, a hardener and a hardening accelerator; said sheet mixture having flexibility in a half hardened state or partially hardened state, wherein said thermosetting resin composition comprises:
1) 4 to 45 weight parts of a first resin that is solid at room temperature,
2) 5 to 50 weight parts of a second resin that is liquid at room temperature,
3) 4.9 to 45 weight parts of said hardener, and
4) 0.1 to 5 weight parts of said hardening accelerator in 100 weight parts of said thermosetting resin composition.

2. A sheet mixture for a thermally conductive substrate according to claim 1, wherein the half hardened state or partially hardened state has viscosity in the range of $10^2$ to $10^5$ (Pa·s).

3. A sheet mixture for a thermally conductive substrate according to claim 1, wherein the half hardened state or partially hardened state has viscosity in the range of $10^3$ to $10^4$ (Pa·s).

4. A sheet mixture for a thermally conductive substrate according to claim 1, wherein 0.1 to 2 weight parts of a solvent having a boiling point of not less than 150° C. is further added to 100 weight parts of a mixture of said inorganic filler and said thermosetting resin it composition.

5. A sheet mixture for a thermally conductive substrate according to claim 4, wherein said solvent having a boiling point of not less than 150° C. is at least one solvent selected from the group consisting of ethyl carbitol, butyl carbitol and butyl carbitol acetate.

6. A sheet mixture for a thermally conductive substrate according to claim 1, wherein said resin that is liquid at room temperature contains one or more components selected from the group consisting of bisphenol A epoxy resin, bisphenol F epoxy resin and liquid phenol resin.

7. A sheet mixture for a thermally conductive substrate according to claim 1, wherein said thermosetting resin composition comprises at least one resin selected from the group consisting of epoxy resin, phenol resin and cyanate resin.

8. A sheet mixture for a thermally conductive substrate according to claim 1, wherein said thermosetting resin comprises a brominated multifunctional epoxy resin, said hardener is a bisphenol A novolak resin, and said hardening accelerator is an imidazole.

9. A sheet mixture for a thermally conductive substrates according to claim 8, wherein said brominated multifunctional epoxy resin comprises in the range of 60 to 80 weight parts; said bisphenol A novolak resin is in the range of 18 to 39.9 weight parts, and said imidazole is in the range of 0.1 to 2 weight parts, in 100 weight parts of said thermosetting resin composition.

10. A sheet mixture for a thermally conductive substrate according to claim 1, wherein said inorganic filler is at least one kind of filler selected from the group consisting of $Al_2O_3$, MgO, BN and AlN.

11. A sheet mixture for a thermally conductive substrate according to claim 1, further comprising at least one additives selected from the group consisting of coupling agent, dispersing agent, coloring agent and tack free agent.

12. A thermally conductive and electrical insulating substrate, comprising one sheet mixture according to claim 1 in a hardened state, wherein the coefficient of thermal expansion of hardened said sheet mixture is in the range of 8 to 20 ppm/° C. and the thermal conductivity is in the range of 1 to 10 W/mK.

13. A thermally conductive and electrical insulating substrate according to claim 12, wherein the flexural strength of said thermally conductive substrate is not less than 10 Kgf/mm$^2$.

14. A thermally conductive and electrical insulating substrate according to claim 12, wherein the flexural strength of said thermally conductive substrate is in the range of 10 to 20 Kgf/mm$^2$.

15. A thermally conductive and electrical insulating substrate according to claim 12, wherein a lead frame comprising an opening space is integrated with the substrate, said opening space is filled with the substrate and a surface of the lead frame is level with a surface of the substrate.

16. A thermally conductive and electrical insulating substrate according to claim 15, wherein a metal substrate for thermal radiation is further formed on the face opposite to the face to which the lead frame is adhered of the thermally conductive substrate.

17. A thermally conductive and electrical insulating substrate according to claim 15, wherein a printed circuit board comprising two or more wiring layers is integrated to the substrate on a face of the substrate to which the lead frame comprising an opening space is adhered.

18. A thermally conductive and electrical insulating substrate according to claim 12, wherein the substrate has a through hole, said through hole is filled with conductive resin composition or is plated with copper, and a metallic foil wiring pattern is further formed and integrated on both sides of the substrate.

19. A thermally conductive and electrical insulating substrate according to claim 12, wherein a plurality of substrates are layered and each of the substrates has a through hole, said through hole is filled with a conductive resin composition and an internal wiring pattern is composed of said conductive resin composition, and a metallic foil wiring pattern is further formed and integrated on both sides of the substrate.

20. A thermally conductive and electrical insulating substrate according to claim 19, wherein said metallic foil is a copper foil having a thickness of 12 to 200 μm and having faces at least one surface of which is a rough surface.

21. A thermally conductive and electrical insulating substrate according to claim 19, wherein said conductive resin composition comprises: (1) 70 to 95 weight parts of at least one metallic powder selected from the group consisting of silver, copper and nickel; and (2) 5 to 30 weight parts of a thermosetting resin composition comprising a thermosetting resin and a hardener.

22. A thermally conductive and electrical insulating substrate according to claim 12, wherein said inorganic filler has a particle diameter of 0.1 to 100 μm on the average.

23. A sheet mixture for a thermally conductive substrate according to claim 1, wherein said sheet mixture further comprises 0.1–2 wt % of at least one solvent having a boiling point of not less than 150° C. and selected from the group consisting of ethyl carbitol, butyl carbitol and butyl carbitol acetate.

* * * * *